United States Patent [19]

Knasel et al.

[11] 4,246,042
[45] Jan. 20, 1981

[54] FIXED SOLAR ENERGY CONCENTRATOR

[75] Inventors: Thomas M. Knasel, McLean; Alexander J. Houghton, Annandale, both of Va.

[73] Assignee: Science Applications, Inc., La Jolla, Calif.

[21] Appl. No.: 121,291

[22] Filed: Feb. 13, 1980

Related U.S. Application Data

[62] Division of Ser. No. 947,656, Oct. 2, 1978.

[51] Int. Cl.$^3$ .............................................. H01L 31/00
[52] U.S. Cl. .................................................. 136/246
[58] Field of Search ................................... 136/89 PC

[56] References Cited

U.S. PATENT DOCUMENTS

| | | | |
|---|---|---|---|
| 4,116,718 | 9/1978 | Yerkes et al. | 136/89 PC |
| 4,162,928 | 7/1979 | Shepard, Jr. | 136/89 PC |

OTHER PUBLICATIONS

N. F. Shepard, Quarterly Report No. 2, JPL Contract 954607, DOE/JPL-954607-78/1, Jan. 1978, pp. 3-10 to 3-16 and 6-1.

*Primary Examiner*—Aaron Weisstuch
*Attorney, Agent, or Firm*—Bruno J. Verbeck; Michael L. Slonecker

[57] ABSTRACT

An apparatus for the concentration of solar energy upon a fixed array of solar cells. A transparent material is overlayed upon the cell array, and a diffuse reflective coating is applied to the surface area of the transparent medium in between cells. Radiant light, which reflects through the transparent layer and does not fall directly incident to a cell surface is reflected by the coating layer in an approximate cosine pattern. Thereafter, such light undergoes internal reflection and rediffusion until subsequently it either strikes a solar cell surface or is lost through the upper surface of the transparent material.

9 Claims, 4 Drawing Figures

FIXED SOLAR ENERGY CONCENTRATOR

This is a division of application Ser. No. 947,656 filed Oct. 2, 1978.

BACKGROUND OF THE INVENTION

The present invention relates to a new and unique means for effecting the efficient collection and concentration of optical energy upon the surface of a fixed photovoltaic cell array. It is an important feature of this invention that such improved solar energy concentration is achieved without the necessity of extensive optical configurations, and sun-tracking or cooling mechanisms.

The use of photovoltaic devices to generate electrical energy is well understood. However, the primary obstacle to their use for generating significant amounts of electrical energy is their cost per peak watt. Current efforts to reduce construction costs of photovoltaic power systems include attempts to increase solar energy concentration on array surfaces by means of specular reflection and refraction. For example, in U.S. Pat. No. 3,427,200 of E. E. Lapin, et al., there is disclosed an apparatus that achieves solar energy concentration by means of specular reflection from polished, metallic sidewalls. Similarly, U.S. Pat. No. 3,873,829 of Evrard, et al., discloses an apparatus utilizing prisms to produce repeated total internal specular reflection of incident light. While the use of such means can substantially increase the output power of photovoltaic arrays, they require expensive optical configurations and complicated sun-tracking mechanisms. Furthermore, it is widely recognized that power efficiency of photovoltaic devices decreases with increase in temperature, necessitating some type of cooling mechanism where high concentration levels are encountered or sought. It is a unique feature of the present invention that moderate concentration ratios are utilized, therefore, eliminating the need for a cooling device.

The above-described problems are among the principal reasons why commercial use of photovoltaic cell arrays capable of high levels of optical energy concentration require special design and are costly to manufacture.

SUMMARY OF THE INVENTION

The present invention utilizes the principle of diffuse, versus specular, reflection to achieve concentration of solar energy upon the surface of a fixed configuration of photovoltaic cells. This enhancement of solar energy is effected by refracting sunlight by means of a sheet of transparent material overlayed upon a solar cell array. Affixed to the material surface area between the solar cells is a diffuse reflective coating. Radiant energy refracting through the transparent layer, which does not initially fall incident upon a cell surface, strikes the diffuse coating and undergoes reflection in an approximate cosine pattern. Under Snell's Law, the light reflected from the diffuse surface at an angle greater than the critical angle of the transparent material experiences total internal reflection. Thereafter, it either falls incident upon a cell surface or is rediffused by the reflective coating. The unique feature of our invention is that the structure permits the acceptance of solar energy arriving from virtually any azimuthal angle, thereby providing a simple and low cost method for effecting solar energy concentration.

DESCRIPTION OF THE PREFERRED EMBODIMENT

Figure 1:
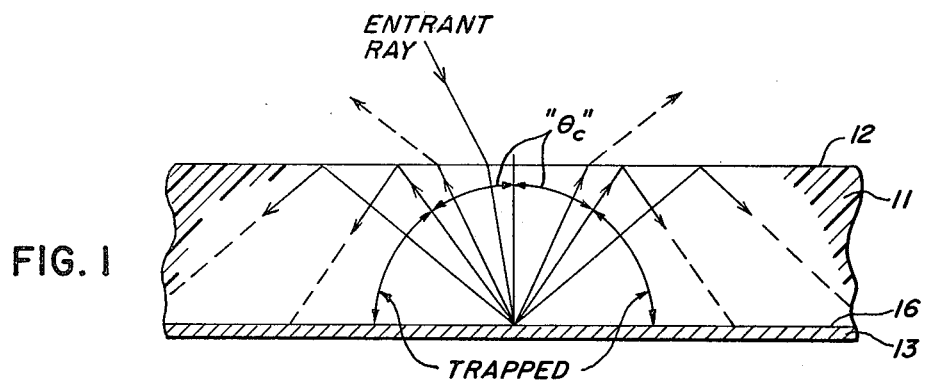
FIG. 1 is a diagram illustrating the physical principles involved in our unique device.
Figure 2:
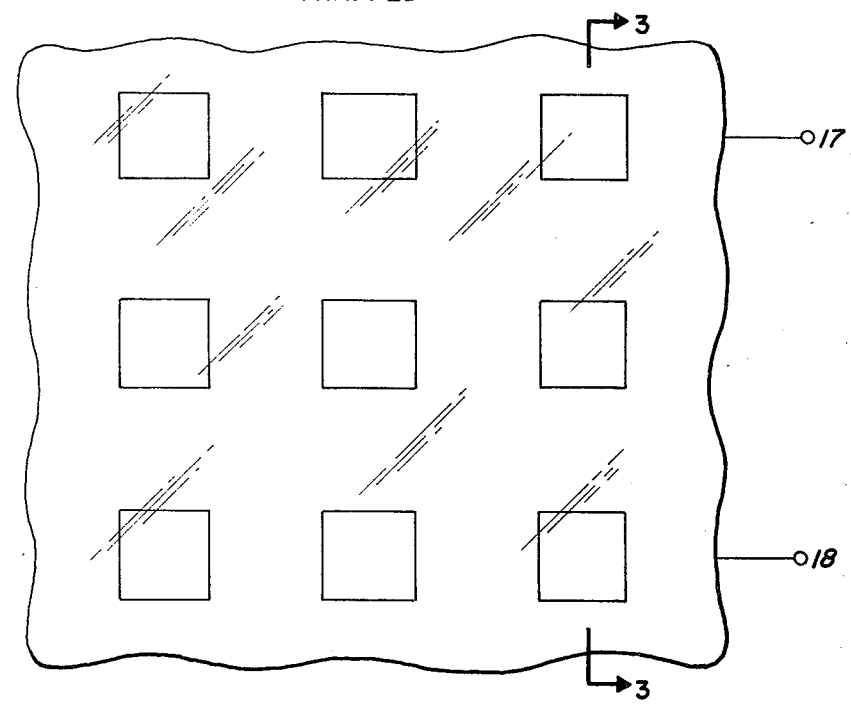
FIG. 2 is a plan view of an array of fixed photovoltaic cells comprising a solar energy concentrator in accordance with the embodiment of our invention.

For a more complete understanding of our invention, reference may be made to FIG. 1 which illustrates the physical principles involved with our invention. More specifically, FIG. 1 depicts the structure of our invention—but without the photovoltaic cell array secured to the lower surface 16 of the transparent sheet or film 11. Radiant light striking the transparent upper surface 12 of the sheet or film 11 undergoes refraction, and is directed to the lower surface 16. Secured to the lower surface 16 is a coating 13 of diffuse reflective material. Unlike the prior art devices, the refracted rays are reflected from the coating 13 is a cosine, rather than specular, pattern. Light reflected by the coating 13 at an angle greater than the critical angle, generally denoted as $\theta_c$ of the sheet or film 11 experiences total internal reflection in accordance with Snell's Law: By this means the concentration of solar energy available for conversion to electrical power is thereby accomplished.

Figure 3:
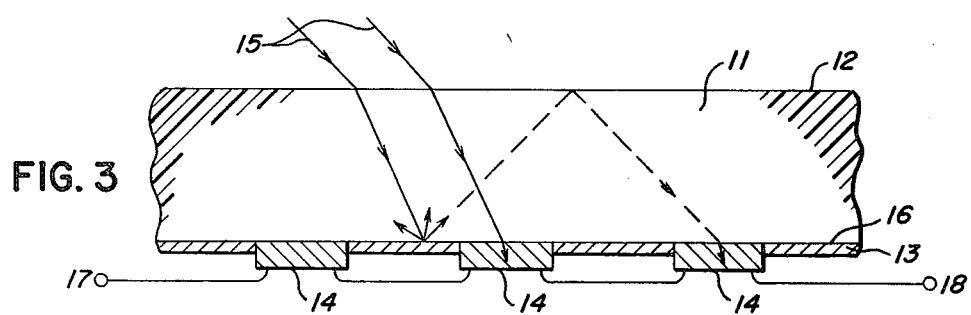
FIG. 3 is a view in section of the array of cells shown in FIG. 2, along line 3—3.

FIG. 3 is substantially identical to FIG. 1 except that it illustrates a fixed photovoltaic cell array 14, secured to the lower transparent surface 16, of the sheet or film 11. The portion of surface 16 to which the cells 14 are not affixed has been coated with a diffuse reflective coating 13. Each ray 15 of solar energy arriving at surface 12 at an angle greater than the grazing angle of the sheet or film 11 will experience refraction. Light refracted through the sheet or film 11 is directed to the lower surface 16, where it will fall incident upon either a cell 14 surface or the diffusion coating 13. Light falling on the cell array will be converted into electrical power in the conventional manner. Light striking the coating 13 will be reflected in diffuse cosine patterns. The portions of ray 15 reflected at an angle greater than the critical angle of sheet or film 11 will undergo total internal reflection as a result of Snell's Law. Such reflected light will thereafter either strike the surface of the cell 14 or will again be reflected in a cosine pattern until such time as it either strikes the cell array or is lost through the upper surface of the transparent sheet or film 11. The electrical energy thereby produced is connected to an external load through the power leads 17 and 18.

The concentration ratio achieved in our unique device is largely determined by the refraction index of the transparent sheet or film 11 and the reflectivity of the diffusion coating 13. While there are surface losses at the surface 12 when the light first enters, such losses are comparable to the protective coating applied to conventional solar cells. Therefore, these losses are not considered further.

The amount of energy incident upon the surface of the solar cell array, which will be absorbed by the cells, is approximated by the expression:

$$\text{ABSORBED} = \text{INCIDENT} \times c \sum_{n=0}^{\infty} R^n(1-c)^n(1-L)^n$$

where:

c is the ratio of the cell array to the array area
R is the reflectivity of the diffusing coating
L is the quantity of energy reflected from the diffusing surface. It the total energy incident upon the array is normalized to unity, L is equal to:

$$\frac{2}{\pi - 2}(\cos\theta + \theta\sin\theta - 1)$$

in which $\theta$ is the critical angle (the arcsin of the reciprocal of the index of refraction).

A number of experiments were conducted to illustrate and establish the comparative efficiencies of solar cell configurations in accordance with the present invention. In each experiment, two solar cell configurations were compared, one consisting of a fixed solar cell concentrator in accordance with the embodiment of our invention, and the other an array of unaugmented cells, viz, cells in an array in which the flat sheet did not have a bottom diffusing surface. Otherwise, the geometrical configurations and cover sheet were identical. The two arrays were then mounted side-by-side and exposed to the sun at varying angles of incident. Thereafter, the power produced by the arrays was measured and compared.

The experimental configurations utilized, for the diffusing coating, is commercially available flat white paint containing pigment which was 70 percent titanium dioxide. The solar cells, SOLAREX, "Chevron" 2 cm. by 2 cm. were coupled to the acrylic sheet with a coating of Dow Corning DC-2 silicon grease. Cell area to total area ratios of 1/9, 4/25, and ¼ were tested. For each area ratio, transparent sheets of 6.4, 12.7 and 25.4 mm. thickness were used. The arrays were relatively small with the largest being 18 cm. square on each side. To reduce edge loss, aluminum foil was coupled to the edge of the transparent sheet with silicon grease.

The data obtained from these experimental configurations established that the embodiment of our invention resulted in increased solar energy concentration upon a fixed solar cell array. For example, the configuration consisting of a transparent sheet possessing the refractive index of 1.5, 12.7 mm. in thickness, and an area ratio of 1/9 resulted in power output 1.6 times greater than without the device.

While observed data was less than predicted results, the differences are believed attributable to the following:

(a) The calculated performance is based on assuming the existence of a true Lambertian diffusing surface and it is probable that since the experimental configuration has specular components in their diffusing pattern, such specular components always serve to reduce the amount of light captured.

(b) The calculated performance assumed a large array of solar cells, the largest experimental arrays were only 18 cm. square. To simulate a larger array, aluminum foil was coupled to the edges of the transparent medium. The reflectivity of this was less than that of the best optical quality aluminum and less than the effect of a large sheet.

(c) The reflectivity of the diffusing coating may be less than the 0.97 to 0.99 assumed in the calculation.

Figure 4:
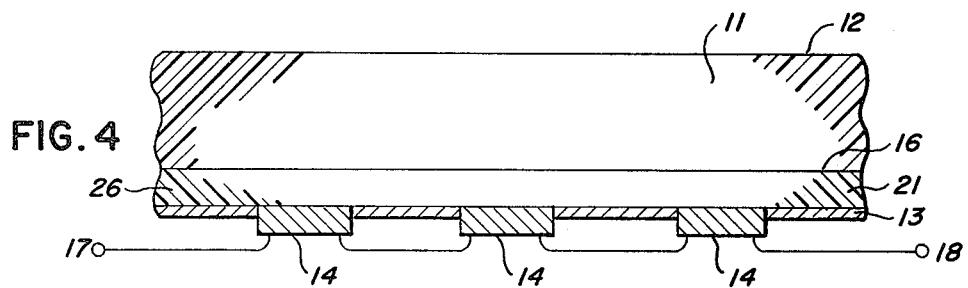
FIG. 4 is a view in section of the array of cells shown in FIG. 2, along line 3—3, constructed in accordance with an alternate embodiment of our invention.

FIG. 4 illustrates an alternate embodiment of our invention wherein a sheet or film 21 is secured to the lower transparent surface 16 of the sheet or film 11. The solar cell array 14 is thereafter secured to the lower transparent surface 26 of the sheet or film 21. The portion of surface 26 to which the cells 14 are not secured has been coated with a diffuse reflective coating 13. This embodiment requires that the refractive index of sheet or film 21 be greater than the refractive index of sheet or film 11. Further, the thickness of sheet or film 21 need only be on the order of a few times the wavelength of the light to be refracted through said sheet or film.

Each ray of solar energy (not shown) arriving at surface 12 at an angle greater than the grazing angle of the sheet or film 11 will experience refraction. Each of these rays will subsequently pass through the lower transparent surface 16 and refract through sheet or film 21. The refracted light will thereafter fall incident upon either a cell 14 surface or the diffusion coating 13. Light striking the diffusion coating 13 will be reflected in a diffuse, rather than aspecular, pattern and will, thereafter, observe the same physical characteristics as described in the disclosure of the preferred embodiment.

It is understood that the above description of our invention is done to fully comply with the requirements of 35 USC 112 and is not intended to limit our invention in any way. It can be seen that variant forms of my invention for concentrating radiant energy could easily be developed by practitioners skilled in the art. More specifically, the transparent material through which the radiant energy refracts may be constructed with one or more sheets or films, each characterized by an index of refraction different from the index of the sheet or film to which it is attached. Further, the photovoltaic cell array need not be secured to the lower surface of the sheet or film to which the diffusing layer is applied. Said array may be secured to the lower surface of any intermediate sheet or film comprising the laminate, its location depending upon the optical properties of the sheets or films and the skilled practitioner's objective of reducing impedance mismatch at the junction of the cell array and lower surface to which it is secured. Thus, for the purpose of interpreting claims, the terms "opposite surface" as used herein has a twofold meaning. First, it defines that portion of the lower surface of a sheet or film within the laminate structure of the transparent material to which the cell array is secured. Second, it further defines the lower surface of the transparent material to which the diffusing coating is applied. Inasmuch as many variant forms of our invention are possible, such variant forms are considered to be within the scope and essence of my invention.

What is claimed is:

1. An apparatus for collecting low level concentrations of radiant energy, said apparatus not limiting the angular acceptance for said energy, whereby said energy is enhanced to a higher level concentration and converted into electrical energy; said apparatus comprising:

(a) an array of photovoltaic cells;
(b) a transparent material having a transparent surface and an opposite surface to which is secured said photovoltaic cell array, said transparent material comprising two or more sheets or films having transparent upper and lower surfaces, each sheet or film possessing an index of refraction different from the index refraction of a sheet or film to which said sheet or film is attached; and (c) a diffusing coating applied to the area of the opposite surface of the transparent material not in contact with the photocoltaic cells.

2. The apparatus of claim 1, wherein said diffusing coating primarily comprises titanium dioxide.

3. The apparatus of claim 1, wherein said sheets or films comprise transparent material selected from the group consisting of glass, plastics, and polycarbons.

4. An apparatus for collecting and utilizing low level concentrations of radiant energy comprising:

(a) a laminate of at least two superimposed sheets of radiant energy transmissive material respectively possessing different indices of refraction and each having a lower surface;

(b) an array of spaced radiant energy responsive devices mounted on the lower surface of one of said superimposed sheets and adapted to receive radiant energy transmitted through said laminate; and (c) a diffusing coating applied to the lower surface of a sheet of said laminate which is disposed therein at a level no higher than said one sheet.

5. Apparatus as in claim 4 wherein said devices are photovoltaic cells.

6. Apparatus as in claim 4 wherein said one sheet is the lowermost sheet of said laminate, and said diffusing coating is applied to the lower surface portions of said one sheet between said devices.

7. Apparatus as in claim 4 wherein said diffusing coating is applied to the lower surface of the lowermost sheet of said laminate, and said one sheet is disposed above said lowermost sheet.

8. Apparatus as in claim 4 wherein the index of refraction of said one sheet is greater than that of a sheet thereabove in said laminate.

9. Apparatus as in claim 4 wherein said one sheet is the lowermost sheet in said laminate and has an index of refraction greater than that of a sheet thereabove in said laminate; and said diffusing coating is applied to the portions of the lower surface of said one sheet between said devices.

* * * * *